(12) United States Patent
Gutentag

(10) Patent No.: US 8,132,673 B1
(45) Date of Patent: Mar. 13, 2012

(54) METHOD AND APPARATUS FOR RETENTION OF SMALL COMPONENTS ON ADHESIVE BACKED CARRIER TAPE

(76) Inventor: Charles Gutentag, Los Angeles, CA (US)

( * ) Notice: Subject to any disclaimer, the term of this patent is extended or adjusted under 35 U.S.C. 154(b) by 530 days.

(21) Appl. No.: 12/075,032

(22) Filed: Mar. 7, 2008

(51) Int. Cl.
*B65D 73/02* (2006.01)
*B65D 85/30* (2006.01)

(52) U.S. Cl. .................. 206/714; 206/813; 206/460

(58) Field of Classification Search .............. 206/714, 206/562–564, 713, 716, 813, 460, 715, 717
See application file for complete search history.

(56) References Cited

U.S. PATENT DOCUMENTS

| | | | |
|---|---|---|---|
| 3,608,711 A * | 9/1971 | Wiesler et al. ............. | 206/714 |
| 4,298,120 A * | 11/1981 | Kaneko et al. ............. | 206/714 |
| 4,966,282 A * | 10/1990 | Kawanishi et al. ......... | 206/714 |
| 5,524,765 A * | 6/1996 | Gutentag .................... | 206/713 |
| 5,857,572 A * | 1/1999 | Bird et al. .................. | 206/713 |
| 5,960,961 A * | 10/1999 | Gutentag .................... | 206/714 |
| 6,357,594 B1 * | 3/2002 | Gutentag .................... | 206/714 |
| 7,097,040 B1 * | 8/2006 | Gutentag .................... | 206/714 |

\* cited by examiner

*Primary Examiner* — Mickey Yu
*Assistant Examiner* — Chun Cheung
(74) *Attorney, Agent, or Firm* — Thomas I. Rozsa

(57) ABSTRACT

An improved continuous adhesive backed carrier tape which eliminates the need for a lift pin to assist in removing components from the compartments in the carrier tape within which the components are adhesively retained. The improvements are achieved by utilizing a strip of continuous length containing a low tack adhesive coating within the central portion of the plastic strip located to underlie the entire bottom of each carrier tape compartment when the strip is affixed there to by either aggressive adhesive rails or by mechanical means, such as ultra sonic bonding. The unique feature is to affix low tack adhesive means underneath the compartment area of the carrier tape, sufficient to retain small, lightweight components yet an adhesion level that is low enough to enable the component to be removed using conventional vacuum pick tools without lift pin assistance.

20 Claims, 7 Drawing Sheets

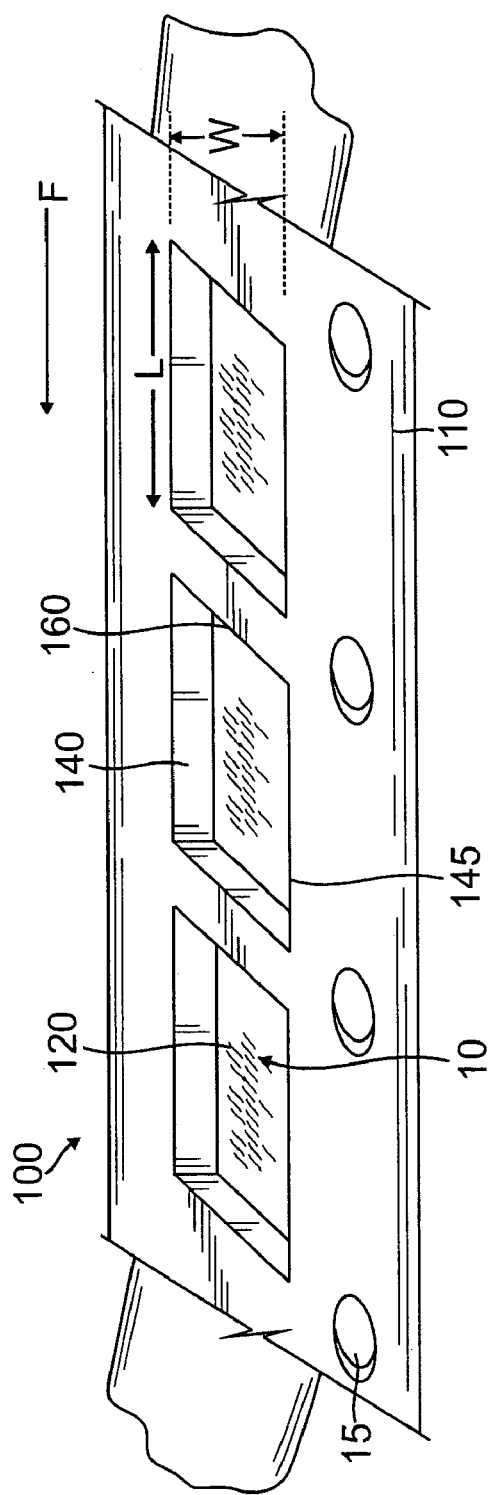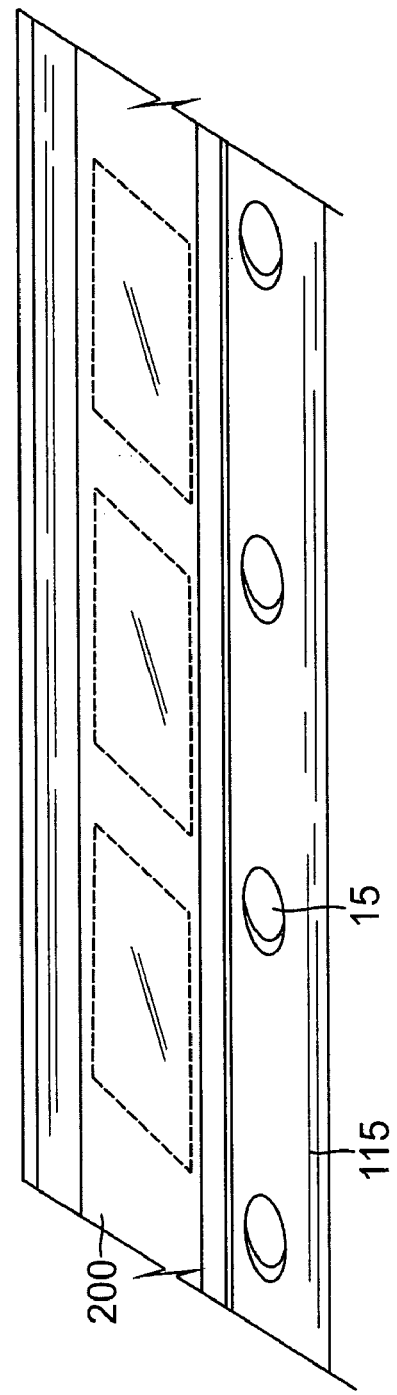

METHOD AND APPARATUS FOR RETENTION OF SMALL COMPONENTS ON ADHESIVE BACKED CARRIER TAPE

BACKGROUND OF THE INVENTION

1. Field of the Invention

This invention relates to the field of packaging systems for automated component handling. Specifically, the present invention relates to carrier tape packaging systems utilizing pressure sensitive adhesive (PSA) tape for component retention. More particularly, the present invention incorporates a unique way to securely retain small lightweight components.

2. Description of the Prior Art

Three basic forms of carrier tape as defined by Industry Standards are presently utilized for packing a wide range of electronic components of varied shapes and sizes in tape and reel formats to facilitate automated processing and assembly handing of these devices. These basic forms of carrier tape are broadly defined by current Industry Standards as: Embossed; Punched; and Adhesive Backed.

Embossed Carrier Tape: (also known as pocket tape or blister tape) consists of a plurality of tub-like cavities formed in continuous lengths of plastic to fit the "3D" outline dimensions of each specific size and shape of device to be placed therein, then sealed for retention in the cavities by a translucent plastic cover tape of continuous length. One form of commercially available cover tape contains two spaced apart rails of pressure sensitive adhesive material which serves to bond the cover tape when laminated to the upper surface of the embossed carrier tape, to seal components within tape pockets during automated tape and reel handling. There is no adhesive material in the central area of the cover tape which overlies the cavities in which the small components such as a wafer die are placed and transported.

Punched Carrier Tape: Comprises a plurality of rectangular-shaped holes pierced through continuous lengths of carrier material (typically paper or plastic). Holes are sized to closely fit the X-Y dimensions of devices to be placed therein and comprise cavities to retain these components by means of top and bottom dual cover tapes of continuous length, sealed to both sides of the punched carrier tape.

Adhesive Backed Carrier Tape: Comprises a plurality of compartments of maximum practical size consistent with each industry standard carrier tape width, pierced through continuous lengths of carrier tape material (typically plastic) to which one or more strips of pressure sensitive adhesive tape are affixed to one side to provide an adhesive base within each compartment to retain components placed thereon.

None of the three aforesaid basic forms of carrier tapes offered for sale commercially provide viable solutions for high-speed automated handling of the proliferation of vanishingly small electronic components whose dimensions together with unit weight continue to diminish, seemingly without limit. The vast market for hand-held consumer electronics products such as mobile phones and PDAs with continuing customer demands for "smaller-lighter-more features and lower-cost" has driven reduction of component dimensions and resulting unit mass by orders of magnitude. Typical IC wafer die products in the early 1990's averaged 2 to 5 millimeters per side with thickness dimension of 0.5 to 0.6 millimeters. One decade later, the typical dimensions of functionally equivalent bare die have shrunk to 150 to 250 microns (6 to 10 mils) per side, (cut size) with 50 to 75 micron thickness dimensions. Even full-featured microprocessor die measuring 20 millimeters or more per side are becoming less than paper thin, by means of wafer back grinding, to enable requisite thermal management when in use. Unintended consequences of the foregoing "Sea Changes" in both size and resulting mass of electronic components in general and bare die products in particular include greater fragility of these devices which require further safeguards against damage during handling. In addition, the combination of micron-size footprints and thickness dimensions reduces the mass of each device to the extent that some of the smallest devices can literally defy Newton's Laws of Gravity, and in fact, frequently do so at automated component handling sites. Such airborne particles become contamination within clean rooms where such automated component handling takes place and can cause injury to machine operators together with damage to adjacent work in process and processing machinery.

Limitations of present day commercially available carrier tapes to provide needed solutions for problems encountered during automated handling of extremely small low mass electronic components include all of the following:

Limitations of Both Embossed and Punched Carrier Tapes with Cover Tapes Sealed to Retain Components within Individual Cavities.

1. Peel back removal of carrier tape to open each cavity for component retrieval causes very small components to become disoriented within or be ejected from cavities, caused by forces induced by electrostatic discharge together with vibration of carrier tape due to uneven peel-back release of cover tape from the carrier tape. Assembly machines vision systems are frequently unable to locate very small components for consistent pick retrieval from cavities. The result; dramatic reductions in machine throughputs and yields with inversely proportional cost increases.

2. Inability to reduce cavity size to closely match dimensions of tiny components within to maintain repeatable component orientation, yet enable components to be removed by conventional pick tools.

3. Tendency of very thin devices to migrate to adjacent cavities during reeling and de-reeling of carrier tape. Many of those very thin devices will slide beneath the cover tape, which is not cross-sealed between cavities. This phenomenon is known as "Shingling"

Adhesive Backed Carrier Tapes:

Pressure sensitive adhesive tape affixed as single or multiple strips to the backside of the component carrier tape must provide an optimum tape-to-component bond, which is minimally sufficient to hold devices securely during automated handling. Excessive adhesion (more than the minimum requirement) will impede rapid, unassisted separation of very small components, especially bare die products, from the adhesive tape backing, using commercially available pick tools for component retrieval and assembly placement.

The choices for adhesive backing tape acceptable for use with carrier tape to contain IC wafer die are limited to those which have been qualified and certified for use in processing IC wafers, and the bare die products singulated therefrom. This restriction is consistent with strict controls of all materials which come into contact with bare IC wafers and wafer die to avoid any measurable amount of contamination which could degrade or cause damage to fragile IC wafer die products. The commercially available pressure sensitive tapes which are qualified and certified for use with bare die vary in adhesive strength ratings. The selection of a minimum adhesive strength is governed by the over arching first requirement for adhesion strength which is sufficient to firmly secure the adhesive tape backing to the base punched plastic carrier tape material to avoid subsequent de-lamination during reeling and de-reeling.

In point of fact, the minimum adhesion strength of backing tape which is sufficient to ensure its firm attached to the base carrier tape is substantially greater than the minimum adhesive bond strength required for retention of small IC wafer die in fixed repeatable positions throughout the entire length of adhesive backed carrier tapes. Accordingly, bare die picked from wafers which have been diced on a solid matrix of qualified wafer dicing tape are individually picked from the dicing tape, assisted by one or more poke-up needles which penetrate the wafer dicing tape backing and rise in unison with the vacuum pick tool to enable separation from the aggressive adhesive dicing tape base.

Adhesive-backed carrier tape offers many advantages for handling these small light weight components and overcomes the major objections voiced by assembly users to conventional pocket tape and punched carrier tape with cover tape(s) for packing and handling extremely small low mass components. However, a major assembly user objection to present forms of adhesive backed carrier tape is the need for a lift pin in each tape feeder to assist the vacuum pick tool in removing each component from the adhesive backing. Such feeders with a lift pin are very costly when compared to feeders for conventional punched carrier tape or embossed pocket tape. In addition, these feeders must be custom fitted to each Pick and Place machine platform and integrated with the host computer in order to function successfully. Cost and limited availability of these special feeders has restricted wide spread use and acceptance of adhesive backed carrier tape to a limited number of high volume production applications.

There are major needs for improved adhesive backed carrier tapes which eliminate the need for a pushup pin or lift pins to assist in removing the component from adhesive backed carrier tape compartments and enable unaided pickup by conventional pick tools used on automated pick and place assembly machines. There is a further need to provide a choice of predefined consistent low tack levels of adhesion in each compartment to optimize the component-to-tape bonding strength for a wide range of device types and sizes to ensure consistent repeatable capture and take away possession and placement of each device by conventional pick tools without damage to the devices.

There is a significant need for an improved method and apparatus to retain small components on a carrier tape which overcomes the problems encountered with previously used methodologies and apparatus.

SUMMARY OF THE INVENTION

The primary objective of the present invention is to provide a carrier tape, which is capable of retaining a wide range of component sizes and shapes (including extremely small components) in fixed repeatable locations within the carrier tape compartments. Of equal importance, the adhesive bond must allow ready removal of these components, without damage, by means of commercially available pick tools, without need for a lift pin to assist in releasing the components from the adhesive backing. In this manner, tape feeders designed for use with conventional punched carrier tape can be utilized with components held in place within compartments with an adhesive backing. As previously described under Description of Prior Art, calibrated levels of adhesion are required to securely retain each device in its "as placed" position, yet allow ready removal when picked directly from adhesive backed carrier tape within compartments without a lift-pin assistance. Feeders for conventional punched carrier tapes are in abundance at circuit board assembly facilities and are well suited for use with calibrated low tack adhesive backed carrier tape. Many fine pitch assembly placement machines are equipped with motor driven feeders with precision indexing to enable repeatable indexing of devices to the feeder pick point.

Another objective of the present invention is to present extremely small components or devices precisely and repeatably positioned at the Pick Point for 'blind pick' assembly, without need for machine vision, thereby substantially increasing both machine throughput as well as yields of finished product to minimize the need for costly rework.

Another object of the present invention is to permit continued utilization of high-speed packaging machines which employ a walking beam together with the positioning combs to sweep quantities of tiny passive devices such as resistors and capacitors into the open top cavities of both punched and embossed carrier tape prior to application of cover tape. Here, the means for component transfer to the adhesive-backed carrier could remain essentially the same and the devices could be affixed to the adhesive substrate by action of a vacuum incrementally applied within each pre-sized machine duct cavity to seat each device onto the adhesive tape, to ensure repeatable positioning.

A further objective of the present invention is to provide a carrier tape with compartments of maximum size consistent with the dimensions of the carrier tape and its structural integrity requirements, so that a single carrier tape can accommodate a wide range of component sizes. Punched and embossed carrier tapes contain pre-sized cavities designed to fit a specific set of component dimensions. Accordingly, each variation in component size and shape may require a separate carrier tape with custom-sized cavities. This represents an additional cost to the component manufacturer and to the assembly user in order to obtain and maintain stocks of carrier tape on hand as needed, especially for bare die products for which no outline dimension industry standards have been established.

Further novel features and other objects of the present invention will become apparent from the following detailed description and discussion, taken in conjunction with the drawings.

BRIEF DESCRIPTION OF THE DRAWINGS

Referring particularly to the drawings for the purpose of illustration only and not limitation, there is illustrated:

FIG. 1 is a perspective view of a conventional PSA cover tape laminated to a carrier tape with an added low tack adhesive 120 applied to the area 230 between PSA rails to cover the interior lower area of each compartment 10;

FIG. 2 is a perspective view of a cover tape 200 affixed to a carrier tape 100 viewed from below, with the cover tape completely covering the interior lower area of each compartment 10;

DETAILED DESCRIPTION OF THE PREFERRED EMBODIMENTS

Figure 1A:
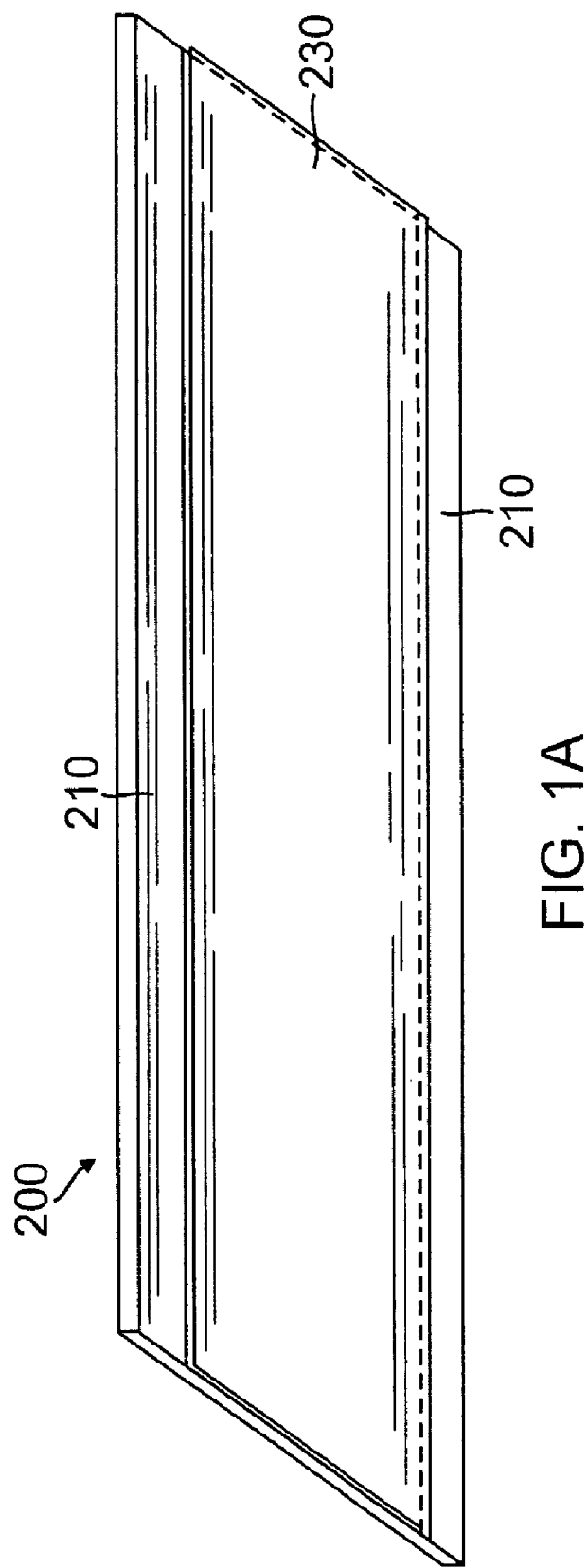
FIG. 1A is an inverted perspective view of a commercially available PSA cover tape 200 having spaced apart pressure sensitive adhesive rails 210 on the cover tape and an uncoated central longitudinal area 230 to which a calibrated level of low tack adhesive will be applied prior to lamination of the cover tape 200.

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

The present invention is an improved continuous carrier tape, which eliminates the need for a lift pin or poke-up needle to assist in removing components from a low tack PSA substrate beneath compartments to the carrier tape to which the components are affixed. The improvements manifest in the present invention are achieved by utilizing a form of pressure sensitive cover tape which contains adhesive means thereon by which the cover tape can be laminated to the bottom surface of the carrier tape to close the lower area of carrier tape compartments. Conventionally, the central area of the cover tape positioned to close the carrier tape cavity area contains no adhesive. The unique feature of the present invention is to affix adhesive means beneath each compartment of the carrier tape, which adhesive means is sufficient to retain lightweight components but provides an adhesion level which is low enough to enable the component to be removed by commercially available pick tools and does not require the further assistance of a push-up or lift pin to release the component from beneath to assist in its removal from the carrier tape adhesive beneath each compartment.

One version of adhesive backed carrier tape sold under the Registered Trademark name of SURFTAPE and protected by U.S. Pat. No. 5,203,143 for Multiple and Split Pressure Sensitive Adhesive Stratums For Carrier Tape Packaging Systems which is incorporated herein by reference features split rails of non-UV sensitive adhesive tape to reduce the amount of adhesive surface exposed to each component. Useful for packaging larger devices to reduce total adhesion, the SURFTAPE approach continues the requirement for lift pins to release components from the adhesive backing tape.

The total solution to the problems aforesaid is achieved by reducing adhesion selectively at component placement sites only to extremely low tack levels which will suffice to retain components securely in position during reeling and de-reeling, yet enable ready release without damage, absent the need for lift pin assistance. Depending upon component size, mass, surface finish and other physical characteristics, requisite adhesive levels could range upwards from less than 1 gram per square centimeter of adhesive to the device bond area. The acceptance range is 0.01 Newton to 0.1 Newton. The optimum level of peel force adhesion would range from 5 to 20 grams per square centimeter. This range of extremely low tack residual adhesion levels is within the range of adhesion needed for optimum tape to component bonding of small light weight devices, especially singulated bare wafer die: minimally sufficient to retain devices securely during reeling and de-reeling, yet enable retrieval by commercially available pick tools without auxiliary lift pin assistance.

Varied levels of adhesion for tape to device bonding can be provided in both standard and custom calibrated forms with no change in materials used for manufacturing. A principal material for a low-tack adhesive to be applied between the two PSA rails of commercially available PSA cover tape, would comprise a liquid adhesive, applied by controlled spray technology developed for ink jet printers. Varying the density of the spray, a wide range of adhesive bond strengths can be achieved. For example: a fine mist spray with extremely small, spaced apart pixels will provide a minimum adhesion, whereas the same adhesive with closely spaced pixels would provide a more aggressive adhesion. Adhesive spray equipment, now commercially available, can be programmed to produce a range of spray patterns, each of which can be calibrated to achieve adhesion levels in predetermined increments: (e.g. 1-2 grams; 3-5 grams; 6-10 grams, etc). Liquid adhesive may be applied to the clearance area between the two rails of PSA cover tape by means of offset printing from a rotary print transfer wheel, which applies adhesive in patterns, with voids, customized for the device being placed. Reciprocating print pad technology is another method for applying liquid adhesive to the empty cover tape area.

A further reduction in the effective low tack adhesion levels is attainable by selective incorporation of one or more rectangular apertures to further reduce the adhesive bonding area beneath the pocket area, which the component is affixed. In similar fashion the low tack adhesive bonding area to which components will be affixed, can be perforated with a pattern of holes of equal or unequal size and shape to remove a calibrated total area of adhesive material to which components would otherwise be attached.

Referring to FIGS. 1 through 4, there is illustrated one preferred embodiment of the present invention. Referring to FIG. 1, there is shown a perspective view of the carrier tape 100, with a plurality of carrier tape compartments 10. The carrier tape 100 is a smooth ribbon like film, usually made of plastic type material. The carrier tape 100 has a plurality of carrier tape compartments 10 which form a hexahedron volume region. The length L, of an individual carrier tape compartment 10 is generally dependent on the consecutive pitch of the compartments, as well as the nature and thickness of the component to be placed within the compartment. The hexahedron volume region of the carrier tape compartment 10 constitutes a virtual boundary for component placement to enable placement of a multiplicity of device sizes within a compartment of fixed dimensions. The dimensions of said compartments should be maximized consistent with maintaining the structural integrity of the carrier tape itself. Other forms of commercially available adhesive backed carrier tapes offer compartments of 1.0×2.5 mm and 3.1×3.1 mm on carrier tapes 8 mm wide, while compartments of 22×36.4 mm are available on 44 mm wide carrier tapes.

Typical dimensions for the carrier tape 100 thickness D and resulting compartment depth range from 0.25 to 1.0 millimeter. The thickness D of the carrier tape 100 should be somewhat greater than the thickness of the small component to be retained, to prevent damage and dislocation during subsequent reeling and de-reeling The carrier tape 100 is used in automated manufacturing processes. Components are adhesively retained within compartments in the carrier tape. Continuous lengths of carrier tape with components are spooled onto reels. Tape with components are sequentially and repeatably indexed to a specific position or dead spot by the tape feeder processing machinery, thereby accurately and repeatably feeding the carrier tape 100 forward.

The carrier tape has sprocket drive holes 15 which engage the teeth of a sprocket drive wheel or the latch of a lateral pawl of the processing machinery (typically, a tape feeder) to synchronize the indexing of the carrier tape 100 with the action of other processing machinery such as the vacuum pick tool of a pick and place machine. The direction of forward feed F, designated by an arrow at forward feed F, is the Industry Standard feed direction, which the carrier tape 100 moves during processing.

The carrier tape compartment 10 of the carrier tape 100 is typically a vacant hexahedron region, which has four enclosed sides. The four enclosed sides are: the left lateral side 140 and the right lateral side 145 which are lateral to the direction of forward feed F; and a trailing side 160 opposite to the direction of forward feed F. However, the geometry of the compartment could assume any convenient shape suitable for component retention, such as round or oval for example.

The carrier tape has an upper surface 110 and a lower surface 115. The carrier tape thickness is the same as the depth D of the carrier tape compartment 10.

The innovation of the present invention is the incorporation of a cover tape as the medium on which the components are carried within the compartments of the carrier tape 100. Referring to FIG. 1A, a length of PSA cover tape 200 is illustrated. One surface of the cover tape 200 has a pair of spaced apart rails of pressure sensitive adhesive 210 thereon. In conventional use, with punched or embossed carrier tapes, the cover tape is affixed to the top of the lengthwise walls of a pocket or cavity and acts as a cover to enclose components retained within each cavity. The central lengthwise area 230 of the cover tape 200 does not have any adhesive thereon. The pressure sensitive adhesive cover tape is made by companies such as 3M and NEPTCO. The innovation of the present invention is to affix the cover tape 200 to the lower surface 115 of the carrier tape 100 so that the cover tape 200 is affixed by the adhesive rails 210 to provide a secure adhesive bonding to the carrier tape 100. Instead of being pressure sensitive, the adhesive rails 210 can be heat sensitive and are sealed and affixed onto the lower surface 115 of the carrier tape 100 by heat sealing means. PSA cover tape with two rails of adhesive is commercially available and would serve as the lower substrate containing a low adhesion level. However, individual ribbons of translucent plastic with low tack adhesion applied to the contact area 230 and can be affixed to the lower surface 115 of the carrier tape by alternative adhesion means or by mechanical means such as ultrasonic welding, for example.

Initially, the area of cover tape 200 within each pocket 10 has no adhesive. The present invention involves applying low tack adhesive to the entire central area 230 such that the entire bottom area at each compartment is enclosed by the adhesive applied to the surface area 230. Ideally, the level of adhesive will be ½0th of the normal adhesive level found in Blue Nitto tape and other conventional adhesive based carrier tapes used for wafer dicing. The central area 230 should be coated with adhesive 120 before the cover tape 200 is affixed to the carrier tape 100. The desired adhesive level is 1 gram or more of adhesion, depending on the size, mass, surface finish and other physical characteristics of the device to be retained. The present invention enables selection of an adhesion level customized to the size, shape and surface finish of the device to be placed such that it can be removed from the low tack adhesive using conventional vacuum pick tools without lift pin assistance.

Alternatively, the low tack adhesive 120 can be applied to the central area 230 of the cover tape 200 in production as a first stage immediately prior to lamination the cover tape 200 to the lower surface 115 of the carrier tape 100.

Therefore, the present invention provides two levels of adhesion. A strong secure level of adhesion through the adhesive rails 210, firmly affixing the cover tape 200 to the lower surface 115 of the carrier tape 100 and a much lower customized level of adhesion using the low tack adhesive 120 located in the central area 230 of the cove tape 200 which resides beneath each compartment 10 after the cover tape 200 is affixed to the lower surface of carrier tape 100. By way of example, the carrier tape 100 with components in place may traverse linearly along a track or other mechanism such as a tape feeder with the carrier tape 100 face-up as illustrated in FIG. 1 or face down as illustrated in FIG. 2.

As illustrated in FIGS. 1 and 2, the cover tape 200 with low tack adhesion applied in its central area 230 shall be affixed beneath the carrier tape 100 such that it does not overlap the sprocket drive holes 15. The cover tape 200 rests adjacent the opposite edge of the carrier tape 100 with no overlap.

Figure 3:
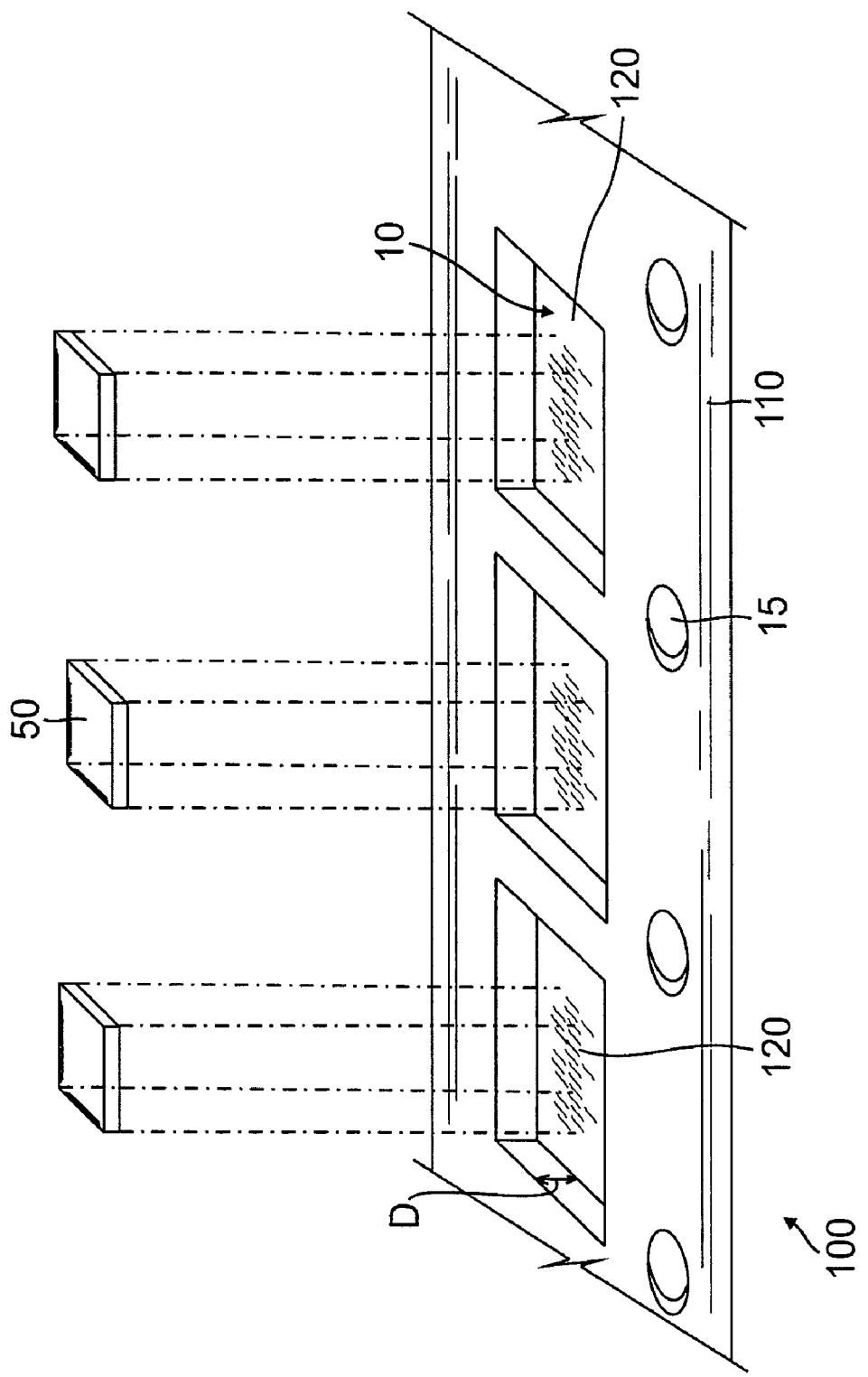
FIG. 3 is a perspective exploded view of the cover tape with low tack adhesive 120 beneath the entire area beneath each compartment of the carrier tape 100 and showing how a component 50 will be placed in each compartment 10.
Figure 4:
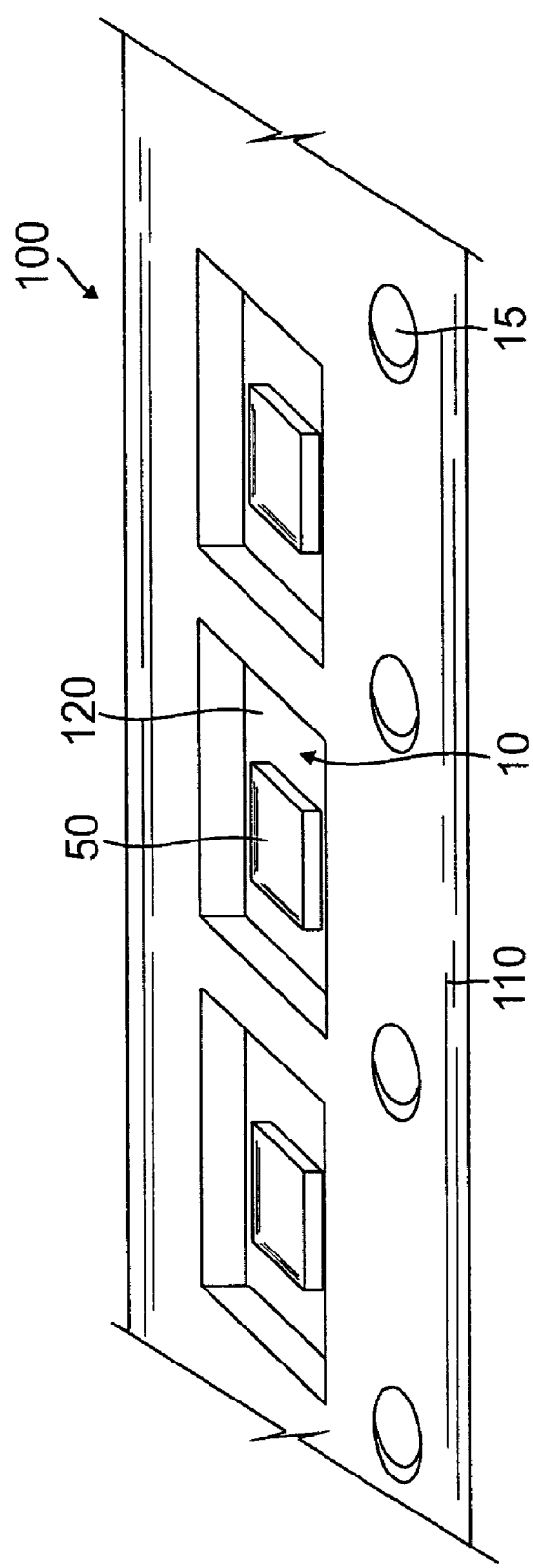
FIG. 4 is a perspective view of the cover tape with low tack adhesive beneath each compartment, with components 50 in place on the low tack adhesive 120 on the cover tape in each compartment 10.

Referring to FIGS. 3 and 4, at the central carrier tape compartments 10 a small component 50 is shown which fits within the carrier tape compartment 10 and is retained therein by the low tack adhesive 120. In one popular application, small components 50 commonly held in this manner are integrated circuit wafer die, also described as tiny chip components.

In an alternative embodiment, illustrated in FIGS. 5 through 8, the amount of adhesion within each compartment is further reduced by piercing an aperture or opening 132 in the cover tape 200 in the approximate center location of each compartment 10 within the area of the low tack adhesive 120. This aperture will be sized and shaped in proportion to the dimensions of the device to be overlaid thereon, such as to reduce the surface area of the adhesive backing tape which can bond to the device. For example, piercing an aperture which represents 50 percent of the total surface area of the device placed precisely on the top of the aperture will achieve a proportionate reduction in the tape-to-component peel adhesion bond strength. Alternatively, there may be a multiplicity of apertures of varied shapes and sizes pierced in the central area 230 of the cover tape 200. By way of example, the slit 132 can be as small as 4/1000 th of an inch wide.

Referring to FIGS. 5 through 8, affixed to the lower surface 115 is one or more lengths of cover tape 200 which is firmly affixed by adhesive rails 210 to the lower surface 115. Because the adhesion tack level of the adhesive rails 210 is sufficiently aggressive, it will not de-laminate during the reeling and de-reeling sequences. A fundamental feature of the present invention is to significantly reduce the adhesion of the area within each compartment 10 by applying a low tack adhesive onto the central area 230 of the cover tape 200 which originally had no adhesive thereon, while maintaining the original aggressive adhesive tack of the adhesive rails 210 of the cover tape 200 to ensure a positive, secure bond to the carrier tape lower surface 115.

The key feature of the present invention is obtaining and maintaining two widely different levels of adhesion at defined locations throughout continuous lengths of cover tape 200 used as the backing material for carrier tape. The result maintains the aggressive attachment required to adhere to the carrier tape frame while reducing the adhesion level beneath each compartment 10 to a level slightly above zero, sufficient only to retain each component in position as placed during automated handling.

This result is achieved in two alternative ways. In the first alternative, a continuous carrier tape 100 such as illustrated in FIG. 1 of a given thickness and having a top side, a bottom side and a multiplicity of individual separated compartments formed therein, each extending from the top side to the bottom side as previously discussed with reference to FIG. 1 is obtained and to the bottom 115 of this carrier tape is adhered a continuous length of cover tape 200 which covers the entire bottom of each of the compartments 10 in the carrier tape 100 and is securely retained thereon by the inherent adhesion strength of adhesive rails 210. Initially, the central area 230 of the cover tape has no adhesion thereon and subsequently, low tack adhesive 120 is applied to this areas to which the components 50 will be retained. With the lower level of adhesion, the components 50 placed into each compartment as illustrated in FIG. 4 are retained by the reduced low tack adhesive 120 in each compartment 10. The adhesive rails 210 by which the cover tape 230 is affixed to the bottom 115 of the carrier tape 100 has an adhesion level which is sufficient to retain the cover tape securely to the carrier tape during reeling and de-reeling. By way of example, this adhesion level will range from 40 grams peel force (0.4 Newton) to as much as 100 grams peel force or more. In Contrast, the low tack adhesive applied to the center area 230 of the cover tape 200 which resides beneath the compartments 10 may have customized adhesion levels ranging upward from 1 gram or less per square centimeter.

Figure 5:
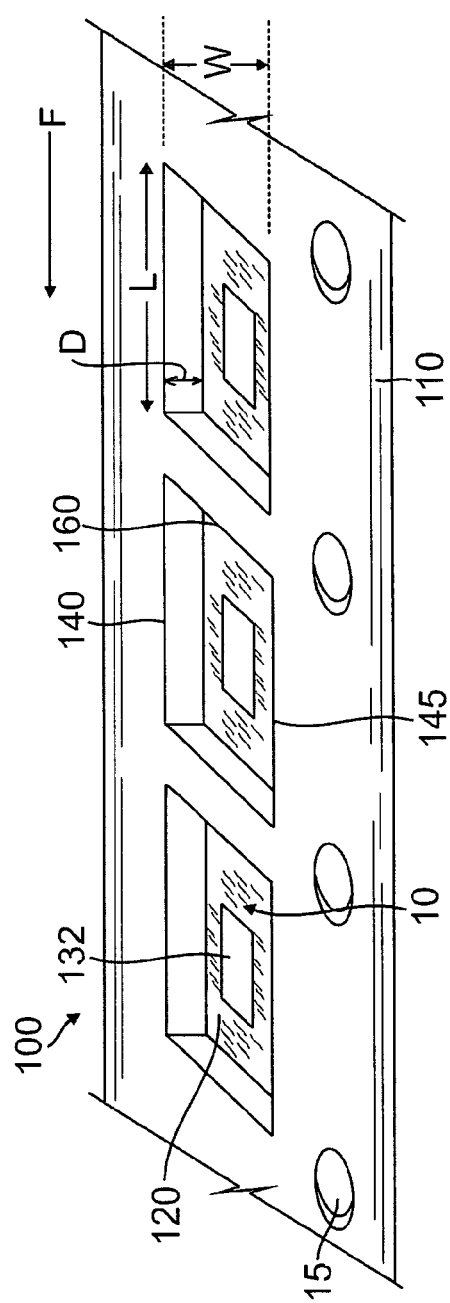
FIG. 5 is a perspective view of a cover tape affixed to a carrier tape having a low tack adhesive covering the interior lower area of each compartment and having a central through hole aperture 132 in the cover tape in the area of the low tack adhesive beneath each compartment.
Figure 6:
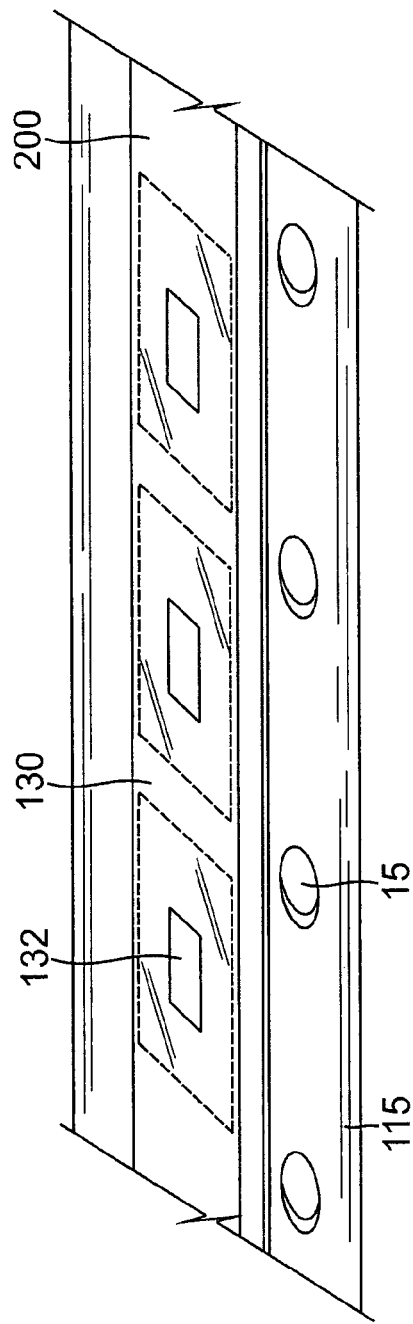
FIG. 6 is a perspective view of a cover tape affixed to a carrier tape viewed from below, with the cover tape completely covering the interior lower area of each compartment and having a central through hole aperture 132 in the cover tape in the area of the low tack adhesive beneath each compartment.
Figure 7:
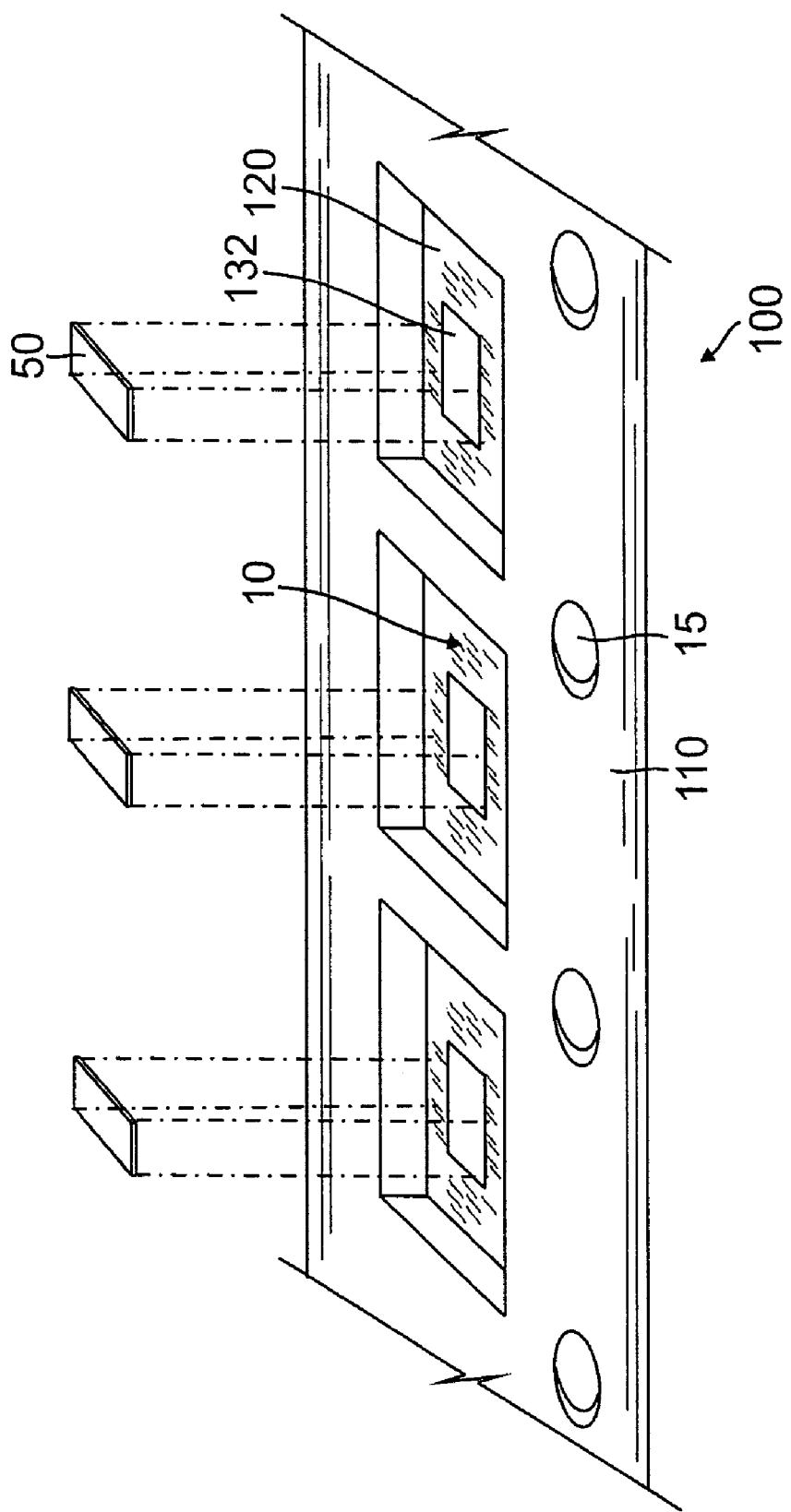
FIG. 7 is a perspective exploded view of the adhesive backed carrier tape, showing how a component will be placed in each compartment, having a central through hole aperture 132 in the cover tape in the area of the low tack adhesive beneath each compartment.
Figure 8:
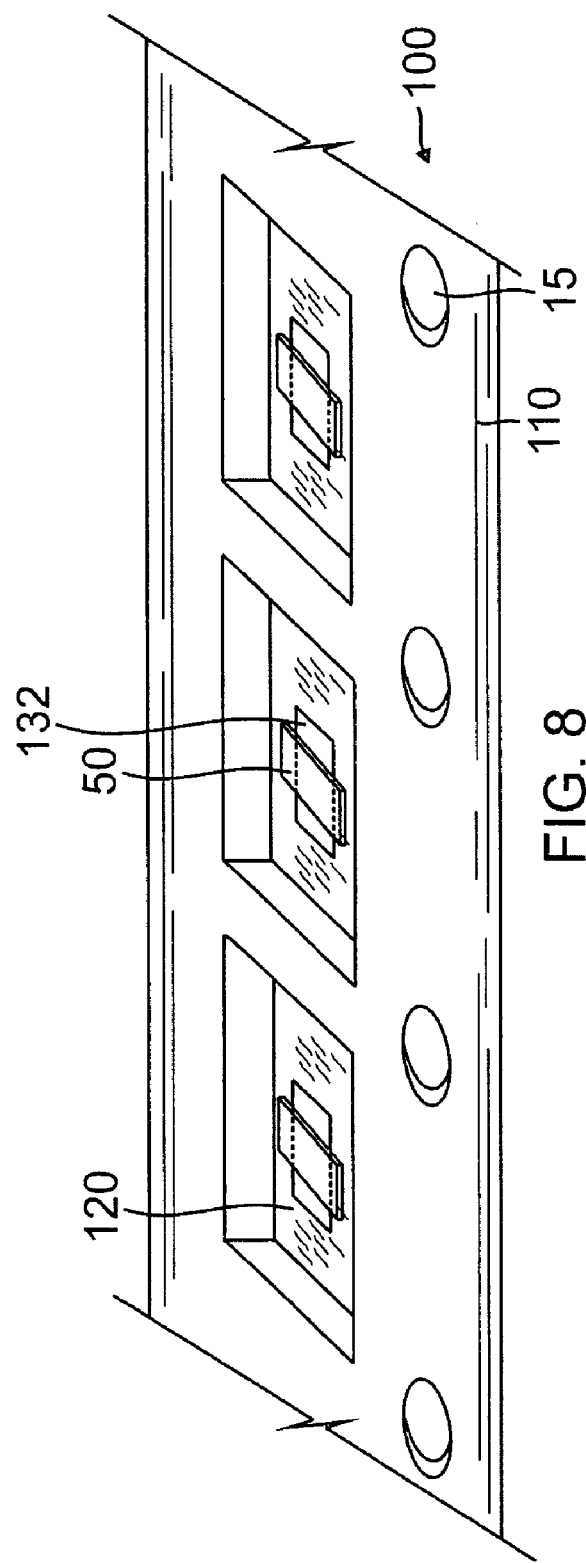
FIG. 8 is a perspective view of the adhesive backed carrier tape, with a component in place over the through hole aperture 132 in the adhesive tape beneath each compartment.

In the second alternative, a slit-to-width continuous length of thin plastic such as polyester or PVC can be coated with the low tack adhesive in the central portion and then affixed to the bottom side of carrier tape 100 and mechanically bonded to the carrier tape using ultrasonic welding, for example, as one means of attachment. The adhesion level of the low tack adhesive 120 within each compartment can be further reduced by creating one or more through holes or apertures of various shapes in the low tack adhesive substrate 120 at the location where a component will be retained so that there is less low tack adhesive 120 to bond to the component 50, illustrated in FIG. 5, a portion of the component will overlay the through hole and only a portion of the component will be adhered to the low tack adhesive 120. The through holes, one of which is illustrated as 132 in cover tape 200 in FIG. 5 can be pierced after the cover tape 200 with low tack adhesive has been laminated to the carrier tape 100. Therefore, in this alternative, a continuous carrier tape 100 such as illustrated in FIG. 5 of a given thickness and having a top side, a bottom side and a multiplicity of individual separated compartments formed therein each extending from the stop side to the bottom side as previously discussed with reference to FIG. 1 is obtained and to the bottom 115 of this carrier tape is adhered a continuous cover tape 200 which covers the entire bottom of each of the compartments 10 in the carrier tape 100. The adhesive rails 210 and 220 have a first adhesion level which is of sufficient strength to cause the cover tape 200 to be firmly adhered to the bottom 115 of the continuous carrier tape 100 to thereby prevent de-lamination of the cover tape 200 from the bottom 115 of the continuous carrier tape 100 during use. Adhesive 120 preferably applied to the central area 230 of the cover tape 200 immediately prior to laminating the cover tape to the bottom of the carrier tape. Thereafter, one or more openings 132 may be created in a portion of this area in each compartment 10 at the location where the component will be affixed. With the reduced components adhesive bond area the components 50 placed into each compartment as illustrated in FIG. 8 are retained by a proportionally lower level of adhesion. The fact that the portion of a component 50 which lies over an opening 132, comprising an adhesive void as illustrated in FIG. 8, results in a further reduction of total component-to-tape bonding. With the component 50 resting over the opening 132, less of the component surface is retained by the low tack adhesive 120 so that the total adhesion level of the component is further reduced.

The present invention has been described in considerable detail in order to comply with the patent laws by providing full public disclosure of at least one of its forms. However, such detailed description is not intended in any way to limit the broad features or principles of the present invention, or the scope of the patent to be granted. Therefore, the invention is to be limited only by the scope of the claims set forth in this patent application. Whereas a PSA cover tape widely used with both standard punched and embossed pocket tapes has been presented as the substrate of choice to contain the low tack 120 to underlie the compartments 10 in carrier tape 100, other alternative means and methods can be employed to achieve a functionally comparable alternative. One such alternative is to utilize a slit width continuous length of plastic such as polyester or PVC, coated one side of the continuous length of plastic with the low tack adhesive and secure said coated plastic by mechanical means such as ultrasonic welding to the bottom of the punched plastic carrier tape 100 so that the low tack adhesive layer covers the entire bottom of each compartment 10.

Defined in detail, the present invention is a carrier tape system for supplying components to a pick and place assembly machine through a feeder, comprising: (a) punched carrier portion having multiple compartments formed therein; (b) a commercially available PSA cover tape, comprising a film strip of continuous length containing two strips of aggressive adhesive material, positioned along the two outboard edges of the film strip; (c) a low tack adhesive applied to the entire area between the two spaced apart adhesive rails; and (d) the cover tape with low tack adhesive laminated to the lower side of the carrier tape portion, secured by the two aggressive PSA spaced apart rails and positioned so that the low tack adhesive covers the entire area of the pierced compartments therein; (e) wherein the low tack adhesive beneath each carrier tape compartment will serve to secure the components during automated handling, yet allow removal without a lift pin or other mechanical assistance, using conventional pick tools.

Defined broadly, the present invention is a carrier tape system for supplying components to a pick and place assembly machine through a feeder, comprising: (a) a punched carrier tape portion having multiple through hole compartments pierced therein; (b) a pressure sensitive adhesive film strip containing a low tack adhesive on one side only, slit to a width suitable for attachment to the pierced carrier tape portion; (c) temporary attachment of the adhesive film strip with the low tack side affixed to the pierced carrier tape portion in position such that the low tack adhesive covers the entire area of the pierced compartment therein; and (d) permanent attachment of the adhesive film strip to the carrier by means of ultrasonic welding to bond both outer edges of the low tack adhesive film strip to the carrier.

Of course the present invention is not intended to be restricted to any particular form or arrangement, or any specific embodiment, or any specific use, disclosed herein, since the same may be modified in various particulars or relations without departing from the spirit or scope of the claimed invention hereinabove shown and described of which the apparatus or method shown is intended only for illustration and disclosure of an operative embodiment and not to show all of the various forms or modifications in which this invention might be embodied or operated.

What is claimed is:

1. A carrier tape for supplying a multiplicity of specific like kind components to a pick and place assembly machine through a feeder, comprising:
   a. a punched carrier portion having multiple compartments formed therein, the carrier tape having a lower surface;
   b. a commercially available PSA cover tape comprising a film strip of continuous length containing two strips of aggressive adhesive material forming two spaced apart aggressive adhesive rails, a respective one of the two spaced apart aggressive adhesive rails respectively positioned along a respective one of two outboard edges of the film strip;
   c. a low tack adhesive applied to an entire area of the cover tape between the two spaced apart aggressive adhesive rails, the low tack adhesive customized to achieve a calibrated level of adhesion for a specific like kind of component being retained by the low tack adhesive so that the low tack adhesive adjacent the lower surface of the carrier tape and beneath each carrier tape compartment will serve to secure each and every one of the like kind components during automated handling yet allow removal without a lift pin or other mechanical assistance using commercially available pick tools; and
   d. the cover tape secured to the lower surface of the carrier tape by the two strips of aggressive adhesive material, the cover tape positioned so that the low tack adhesive covers the entire bottom area of the punched compartment of the carrier tape.

2. The carrier tape for supplying a multiplicity of specific like kind components to a pick and place assembly machine in accordance with claim 1, further comprising:
   a. the level of low tack adhesive on the carrier tape is uniformly adjusted to handle different types of specific components as long as all of the specific components on an individual carrier tape are of like kind; and
   b. the low tack adhesive is customized to achieve a calibrated level of adhesion for the specific type of like kind components so that each and every like kind component is securely retained in position as placed and can be removed without lift pin assistance using conventional pick tools.

3. The carrier tape for supplying a multiplicity of specific like kind components to a pick and place assembly machine in accordance with claim 1, further comprising:
   a. the low tack adhesive is customized to achieve a calibrated level of adhesion in which the amount of adhesion within each compartment is further reduced by piercing an aperture or opening in the cover tape in the approximate center location of each compartment within the area of the low tack adhesive, the aperture is sized and shaped in proportion to the dimension of the like kind component to be overlaid thereon to thereby reduce the surface area of the low tack adhesive tape which can bond to the like kind component.

4. The carrier tape for supplying a multiplicity of specific like kind components to a pick and place assembly machine in accordance with claim 1, further comprising:
   a. the surface area of the low tack adhesive tape is reduced by piercing an aperture which represents fifty percent of the total surface area of the like kind component placed precisely on the top of the aperture which will achieve a proportionate reduction in tape-to-tape component peel adhesion bond strength.

5. The carrier tape for supplying a multiplicity of specific like kind components to a pick and place assembly machine in accordance with claim 1, further comprising:
   a. a multiplicity of apertures of varied shapes and sizes pierced in the low tack adhesive of the cover tape aligned with a central area of each carrier tape compartment to reduce the adhesion by which the like kind component is retained.

6. The carrier tape for supplying a multiplicity of specific like kind components to a pick and place assembly machine in accordance with claim 1, further comprising:
   a. the low tack adhesive applied to the entire area between the two spaced apart adhesive rails is varied to provide optimum individualized levels of adhesive tack best suited to specific types, sizes and contact surfaces including footprints of like kind components to be retained by the low tack adhesive; and
   b. the optimized low tack adhesive beneath each compartment serves to secure the components during automated handling yet allow removal without a lift pin or other mechanical assistance, using commercially available pick tools.

7. The carrier tape for supplying a multiplicity of specific like kind components to a pick and place assembly machine in accordance with claim 1, further comprising:
   a. each like kind component has a micron-sized footprint; and
   b. the customized low tack adhesive is able to retain the micron sized like kind component during reeling and de-reeling of the carrier tape and further prevents the like kind micron-sized component from relocating within a carrier tape compartment within which the like kind micron sized component has been placed.

8. The carrier tape for supplying a multiplicity of specific like kind components to a pick and place assembly machine in accordance with claim 7, further comprising:
   a. each like kind component has a micron-sized footprint; and
   b. the customized low tack adhesive is able to retain the micron sized like kind component at a precise location exactly as placed and where the multiplicity of components are repeatably placed to enable a blind pick assembly without the need for machine vision, thereby substantially increasing both machine throughput as well as yields of finished product to minimize a need for costly rework.

9. The carrier tape for supplying a multiplicity of specific like kind components to a pick and place assembly machine in accordance with claim 7, further comprising:
   a. each compartment in a carrier tape is of maximum size consistent with dimensions of the carrier tape and structural integrity requirements so that a single carrier tape can accommodate a wide range of corresponding like kind component sizes; and
   b. the level of low tack adhesive is sufficient to retain each like kind component during automated handling and allows removal of the like kind component without a lift pin or other mechanical assistance, using commercially available pick tools.

10. The carrier tape for supplying a multiplicity of specific like kind components to a pick and place assembly machine in accordance with claim 1, further comprising:
the level of low tack adhesive requiring a pull force is in the range from approximately 0.01 Newton to 0.1 Newton for removal of a like kind component from a carrier tape, depending on physical characteristics of a like kind component selected from the group consisting of component size, mass, footprint and surface finish.

11. The carrier tape for supplying a multiplicity of specific like kind components to a pick and place assembly machine in accordance with claim 1, further comprising:
a pull force level of low tack adhesive is in the range from approximately five (5) grams to twenty (20) grams, depending on physical characteristics of a like kind component selected from the group consisting of component size, mass, footprint and surface finish.

12. The carrier tape for supplying a multiplicity of specific like kind components to a pick and place assembly machine in accordance with claim 1, further comprising:
a. the low tack adhesive is applied to the PSA cover tape by controlled spray of liquid adhesive; and
b. by varying a density of a spray, a wide range of adhesive bond strength is achieved.

13. The carrier tape for supplying a multiplicity of specific like kind components to a pick and place assembly machine in accordance with claim 12, further comprising:
the density of the spray is varied from the group consisting of a fine mist spray with widely small spaced apart pixels provides a minimum adhesion, and a fine mist spray with closely spaced apart pixels provides aggressive adhesion.

14. The carrier tape for supplying a multiplicity of specific like kind components to a pick and place assembly machine in accordance with claim 12, further comprising:
liquid adhesive applied to the area between the two rails of aggressive adhesive by means selected from the group consisting of offset printing from a rotary print transfer wheel which applies adhesive in patterns and voids which are customized to the like kind component to be retained, and reciprocating print pad technology.

15. A carrier tape for supplying a multiplicity of specific micron-sized like kind components of like kind to a pick and place assembly machine through a feeder, comprising:
a. a punched carrier portion having multiple compartments formed therein, the carrier tape having a lower surface;
b. a commercially available PSA cover tape comprising a film strip of continuous length containing two strips of aggressive adhesive material forming two spaced apart aggressive adhesive rails, a respective one of the two spaced apart aggressive adhesive rails respectively positioned along a respective one of two outboard edges of the film strip;
c. a low tack adhesive applied to an entire area of the cover tape between the two spaced apart aggressive adhesive rails, the low tack adhesive customized to achieve a calibrated level of adhesion for a specific micron-sized like kind of component of like kind being retained by the low tack adhesive so that the low tack adhesive adjacent the lower surface of the carrier tape and beneath each carrier tape compartment will serve to secure each and every one of the micron-sized like kind components of like kind during automated handling yet allow removal without a lift pin or other mechanical assistance using commercially available pick tools; and
d. the cover tape secured to the lower surface of the carrier tape by the two strips of aggressive adhesive material, the cover tape positioned so that the low tack adhesive covers the entire area of the punched compartment of the carrier tape.

16. The carrier tape for supplying a multiplicity of specific micron-sized like kind components of like kind to a pick and place assembly machine in accordance with claim 15, further comprising:
a. the level of low tack adhesive on the carrier tape is uniformly adjusted to handle different types of specific micron-sized components as long as all of the specific micron-sized components on an individual carrier tape are of like kind; and
b. the low tack adhesive is customized to achieve a calibrated level of adhesion for the specific type of micron-sized components of like kind so that each and every micron-sized like kind component is securely retained in position as placed and can be removed without lift pin assistance using convention pick tools.

17. The carrier tape for supplying a multiplicity of specific micron-sized like kind components of like kind to a pick and place assembly machine in accordance with claim 15, further comprising:
a. the low tack adhesive is customized to achieve a calibrated level of adhesion in which the amount of adhesion within each compartment is further reduced by piercing an aperture or opening in the cover tape in the approximate center location of each compartment within the area of the low tack adhesive, the aperture is sized and shaped in proportion to the dimension of the micro-sized components of like kind to be overlaid thereon to thereby reduce the surface area of the low tack adhesive tape which can bond to the micron-sized components of like kind.

18. The carrier tape for supplying a multiplicity of specific micro-sized like kind components of like kind to a pick and place assembly machine in accordance with claim 15, further comprising:
pull force to release components from low tack adhesive is in the range from approximately 0.01 Newton to 0.1 Newton, depending on physical characteristics of a micron-sized component of like kind selected from the group consisting of component size, mass, footprint and surface finish.

19. The carrier tape for supplying a multiplicity of specific micron-sized like kind components of like kind to a pick and place assembly machine in accordance with claim 15, further comprising:
a pull force adhesion level of low tack adhesive is in the range from approximately five (5) grams to twenty (20) grams, depending on physical characteristics of a micron-sized component of like kind selected from the group consisting of component size, mass, footprint and surface finish.

20. The carrier tape for supplying a multiplicity of specific micron-sized components of like kind to a pick and place assembly machine in accordance with claim 15, further comprising:
a. the low tack adhesive is applied to the PSA cover tape by controlled spray of liquid adhesive; and
b. by varying a density of a spray, a wide range of adhesive bond strength is achieved.

* * * * *